(12) United States Patent
Nakaya

(10) Patent No.: US 7,825,442 B2
(45) Date of Patent: Nov. 2, 2010

(54) SEMICONDUCTOR DEVICE AND METHOD OF MANUFACTURING THE SAME

(75) Inventor: Kiyofumi Nakaya, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 486 days.

(21) Appl. No.: 11/709,975

(22) Filed: Feb. 22, 2007

(65) Prior Publication Data

US 2007/0221969 A1   Sep. 27, 2007

(30) Foreign Application Priority Data

Feb. 24, 2006   (JP)   ............................... 2006-048726

(51) Int. Cl.
*H01L 21/00* (2006.01)
(52) U.S. Cl. .................. 257/288; 257/565; 257/365
(58) Field of Classification Search ................ 257/288, 257/565, 365
See application file for complete search history.

(56) References Cited

U.S. PATENT DOCUMENTS

| | | | |
|---|---|---|---|
| 5,932,914 A * | 8/1999 | Horiguchi | 257/355 |
| 6,472,287 B2 * | 10/2002 | Wakabayashi | 438/365 |
| 6,693,344 B1 * | 2/2004 | Sato et al. | 257/553 |
| 6,949,424 B2 | 9/2005 | Springer | |
| 7,560,797 B2 * | 7/2009 | Soma et al. | 257/565 |
| 7,719,081 B2 * | 5/2010 | Soma et al. | 257/511 |
| 2002/0127832 A1 * | 9/2002 | Wakabayashi | 438/550 |
| 2007/0145520 A1 * | 6/2007 | Soma et al. | 257/506 |
| 2007/0145530 A1 * | 6/2007 | Soma et al. | 257/565 |
| 2007/0158754 A1 * | 7/2007 | Soma et al. | 257/370 |
| 2007/0221969 A1 * | 9/2007 | Nakaya | 257/288 |
| 2009/0140367 A1 * | 6/2009 | Iwai | 257/462 |

FOREIGN PATENT DOCUMENTS

| | | |
|---|---|---|
| JP | 10-303209 | 11/1998 |
| JP | 2000-260891 | 9/2000 |

\* cited by examiner

*Primary Examiner*—Laura M Menz
(74) *Attorney, Agent, or Firm*—Fish & Richardson P.C.

(57) ABSTRACT

In a semiconductor device of the present invention, an N type epitaxial layer is formed on a P type silicon substrate. In the epitaxial layer, P type diffusion layers as a base region, N type diffusion layers as collector regions and an N type diffusion layer as an emitter region are formed. In this event, the P type diffusion layers are formed so as to have a double diffusion structure, and an impurity concentration in a surface of the base region and in a region adjacent thereto is set high. This structure enables improvement in high frequency characteristics and in a current amplification factor while maintaining breakdown voltage characteristics of an NPN transistor.

6 Claims, 14 Drawing Sheets

SEMICONDUCTOR DEVICE AND METHOD OF MANUFACTURING THE SAME

BACKGROUND OF THE INVENTION

Priority is claimed to Japanese Patent Application Number JP2006-048726 filed on Feb. 24, 2006, the disclosures of which are incorporated herein by reference in its entirety.

1. Field of the Invention

The present invention relates to a semiconductor device intended to improve high frequency characteristics and a current amplification factor of a transistor.

2. Description of the Related Art

As an example of a conventional semiconductor device and a method of manufacturing the same, the following NPN transistor has been known. An N type epitaxial layer is formed on a P type silicon semiconductor substrate. In the epitaxial layer, an external base region is formed so as to surround an active base region. The external base region is connected to an external base lead-out electrode formed on the epitaxial layer. In addition, an emitter region is formed in the active base region, and is connected to an emitter lead-out electrode. Moreover, a collector region is formed in the epitaxial layer. In this event, an impurity in the external base lead-out electrode is diffused into the epitaxial layer to form the external base region. Moreover, the active base region is formed by implanting ions of an impurity from the surface of the epitaxial layer into a region where the external base lead-out electrode has an opening. Specifically, in the conventional NPN transistor, improvement in high frequency characteristics is achieved by forming the active base region having a small diffusion depth inside the external base region. This technology is described for instance in Japanese Patent Application Publication No. Hei 10 (1998)-303209 (pp. 4-8, FIGS. 1, 10 to 12).

As another example of the conventional semiconductor device, the following NPN transistor has been known. An N type epitaxial layer is formed on a P type silicon semiconductor substrate. A high-concentration N type buried diffusion layer is formed so as to extend in both the P type silicon semiconductor substrate and the N type epitaxial layer. Moreover, in the N type epitaxial layer, a low-concentration P type diffusion layer as an internal base region and an N type diffusion layer as a collector region are formed. In the P type diffusion layer as the internal base region, a high-concentration P type diffusion layer as an external base region and an N type diffusion layer as an emitter region are formed. This technology is described for instance in Japanese Patent Application Publication No. 2000-260891 (pp. 5-6, FIG. 1).

In the conventional semiconductor device, a base resistance value is reduced by forming the emitter region so as to overlap the high-concentration active base region having a small diffusion depth. Thereby, the high frequency characteristics and a current amplification factor of the NPN transistor are improved. However, there is a problem that formation of the high-concentration active base region having a small diffusion depth makes it difficult to obtain desired breakdown voltage characteristics ($V_{CEO}(V)$) in the NPN transistor.

Moreover, in the conventional semiconductor device, the high-concentration diffusion layer as the external base region and the diffusion layer as the emitter region are formed in the low-concentration diffusion layer as the internal base region. Specifically, by forming the low-concentration diffusion layer as the internal base region, desired breakdown voltage characteristics ($V_{CEO}(V)$) of the NPN transistor are achieved. However, since the diffusion layer as the internal base region has a low concentration and a large diffusion depth, a base resistance value is increased. Accordingly, there is a problem that it is difficult to obtain desired high frequency characteristics and a desired current amplification factor of the NPN transistor.

SUMMARY OF THE INVENTION

The present invention was made in consideration of the foregoing circumstances. A semiconductor device of the present invention includes a semiconductor layer, a diffusion layer of one conductivity type, which is formed in the semiconductor layer, and which is used as a base region, a first diffusion layer of opposite conductivity type, which is formed in the diffusion layer of the one conductivity type, and which is used as an emitter region, and a second diffusion layer of the opposite conductivity type, which is formed in the semiconductor layer, and which is used as a collector region. Moreover, the diffusion layer of the one conductivity type has a double diffusion structure. Accordingly, in the present invention, the base region is set to have the double diffusion structure. As a result, high frequency characteristics and a current amplification factor can be improved while maintaining breakdown voltage characteristics of the semiconductor device.

A method of manufacturing a semiconductor device according to the present invention includes the steps of: preparing a semiconductor layer, and forming at least an N-channel MOS transistor and an NPN transistor in the semiconductor layer. In the method, the step of forming a first diffusion layer of one conductivity type used as a base region in the semiconductor layer and forming a second diffusion layer of the one conductivity type so as to overlap a formation region of the first diffusion layer of the one conductivity type, and the step of forming a back gate region of the N-channel MOS transistor in the semiconductor layer are performed in the same step. Moreover, a first diffusion layer of the opposite conductivity type used as an emitter region is formed in a formation region of the second diffusion layer of the one conductivity type. Furthermore, a second diffusion layer of the opposite conductivity type used as a collector region is formed in the semiconductor layer. Accordingly, in the present invention, by forming the diffusion layer used as the base region in the same step, the number of masks can be reduced and manufacturing costs can be reduced.

DETAILED DESCRIPTION OF THE PREFERRED EMBODIMENTS

Figure 1:
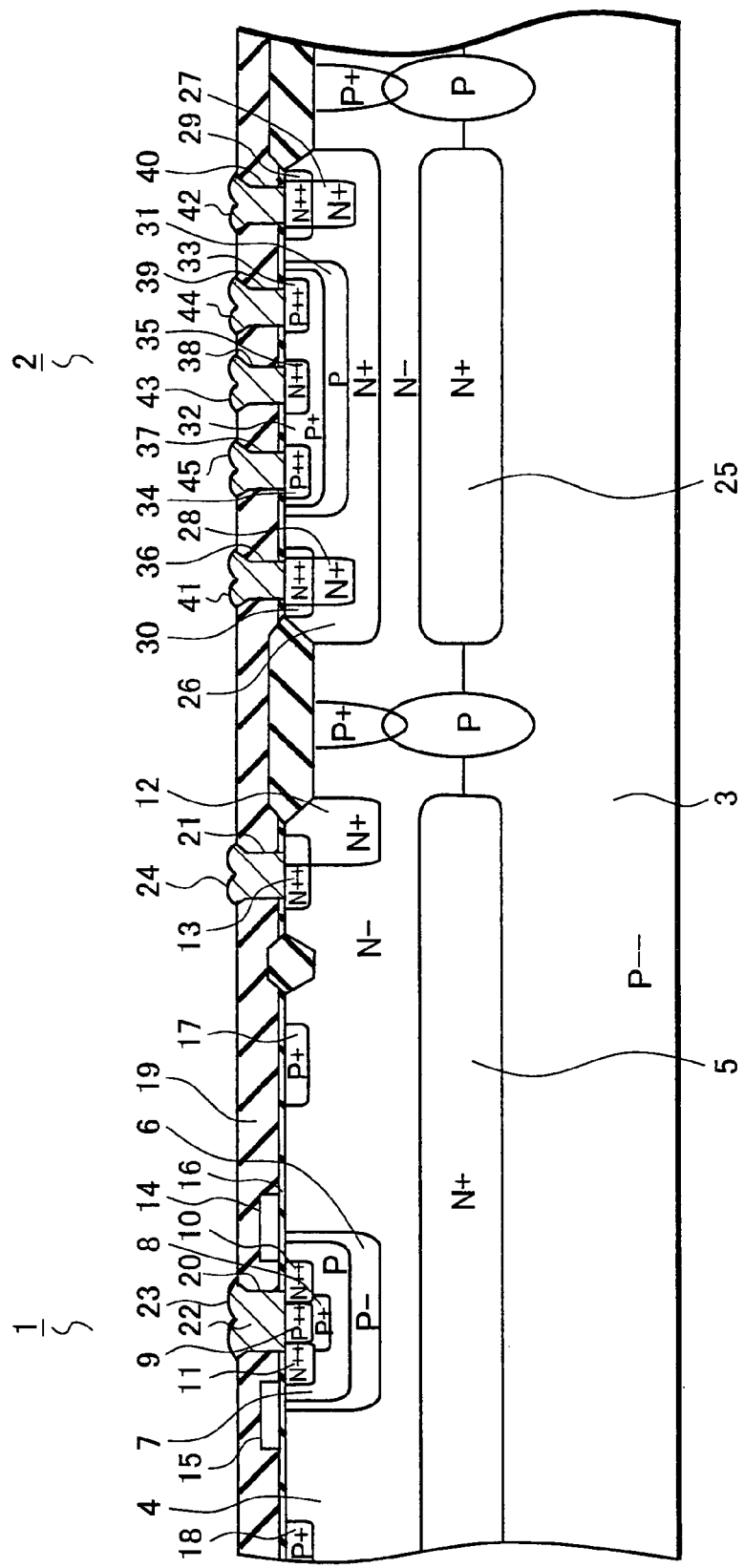
FIG. 1 is a cross-sectional view showing a semiconductor device according to an embodiment of the present invention.
Figure 2:
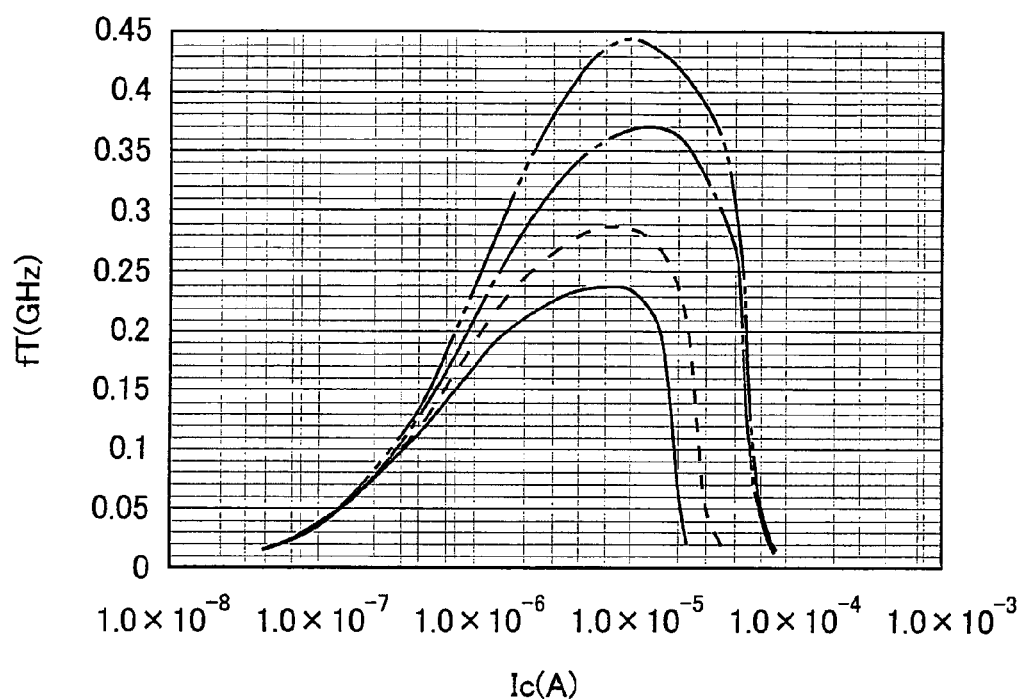
FIG. 2 is a graph showing a relationship between cutoff frequency characteristics (fT) and a collector current (Ic) in the semiconductor device according to the embodiment of the present invention.
Figure 3:
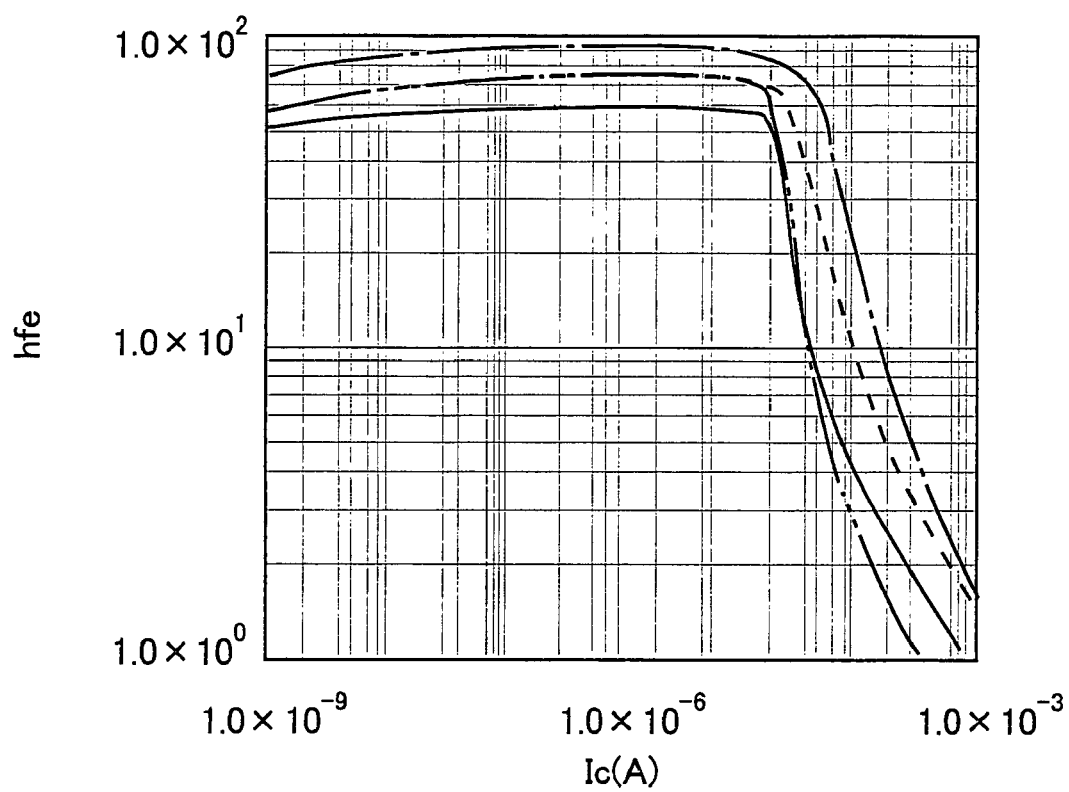
FIG. 3 is a graph showing a relationship between a current amplification factor (hfe) and the collector current (Ic) in the semiconductor device according to the embodiment of the present invention.
Figure 4:
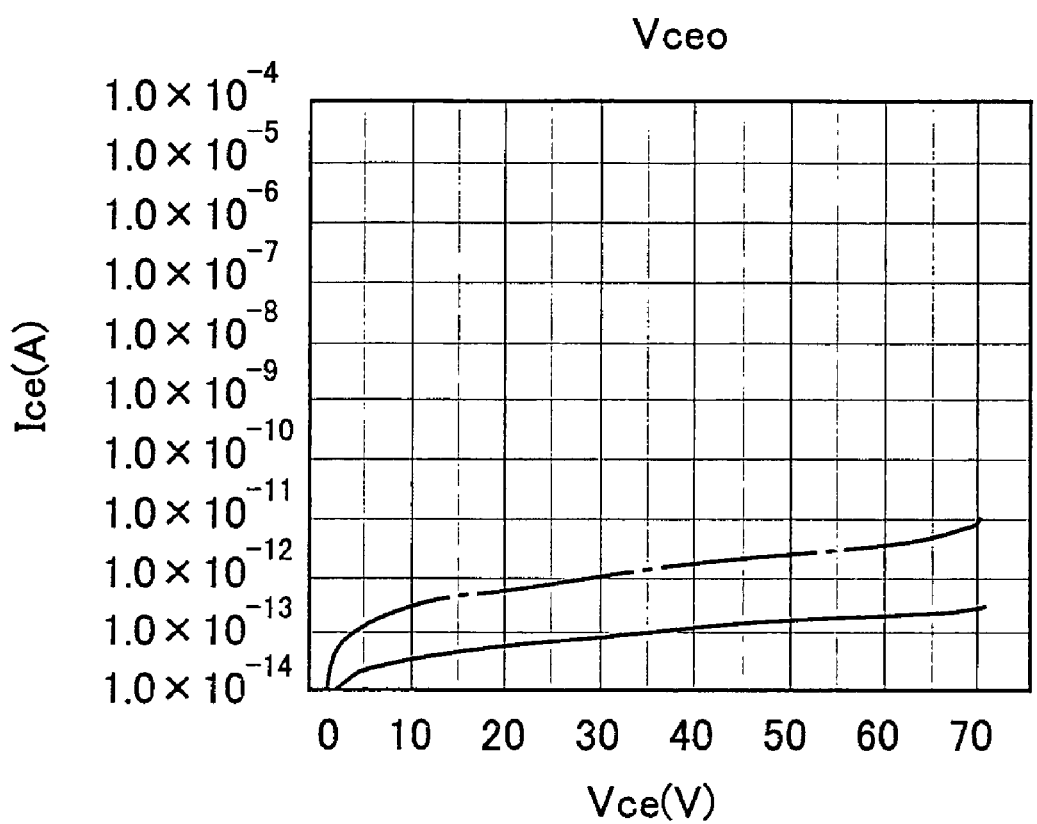
FIG. 4 is a graph showing a relationship between a collector-emitter current (Ice) and a collector-emitter voltage (Vce) in the semiconductor device according to the embodiment of the present invention.

With reference to FIGS. 1 to 4, a semiconductor device according to an embodiment of the present invention will be described in detail below. FIG. 1 is a cross-sectional view showing a semiconductor device according to this embodiment. FIG. 2 is a graph showing a relationship between a cutoff frequency (fT) and a collector current (Ic) in the semiconductor device according to this embodiment. FIG. 3 is a graph showing a relationship between a current amplification factor (hfe) and the collector current (Ic) in the semiconductor device according to this embodiment. FIG. 4 is a graph showing a relationship between a collector-emitter current (Ice) and a collector-emitter voltage (Vce) in the semiconductor device according to this embodiment.

As shown in FIG. 1, an N-channel MOS transistor 1 and an NPN transistor 2 are formed on a same P type single crystal silicon substrate 3. Note that, in the cross-section shown in FIG. 1, a part of the N-channel MOS transistor 1 is omitted.

Next, the N-channel MOS transistor 1 mainly includes the P type single crystal silicon substrate 3, an N type epitaxial layer 4, an N type buried diffusion layer 5, P type diffusion layers 6 to 9 used as a back gate region, N type diffusion layers 10 and 11 used as a source region, N type diffusion layers 12 and 13 used as a drain region and gate electrodes 14 and 15.

The N type epitaxial layer 4 is formed on the P type single crystal silicon substrate 3.

The N type buried diffusion layer 5 is formed so as to extend in both the substrate 3 and the epitaxial layer 4. Note that FIG. 1 shows a part of the N-channel MOS transistor 1 and also a part of the N type buried diffusion layer 5. Moreover, the N type buried diffusion layer 5 is formed across a region where the N-channel MOS transistor 1 is formed (hereinafter such a region is referred to as a formation region).

The P type diffusion layers 6 to 9 are formed in the epitaxial layer 4. The P type diffusion layer 6 is formed under diffusion conditions, that an impurity concentration in its surface is set at about $1.0 \times 10^{13}$ to $1.0 \times 10^{14}$ (/cm$^2$), and that a diffusion depth is set at about 5 to 6 (μm), for example. The P type diffusion layer 7 is formed under diffusion conditions, that an impurity concentration in its surface is set at about $1.0 \times 10^{14}$ to $1.0 \times 10^{15}$ (/cm$^2$), and that a diffusion depth is set at about 2 to 4 (μm), for example. The P type diffusion layer 8 is formed under diffusion conditions, that an impurity concentration in its surface is set at about $1.0 \times 10^{14}$ to $1.0 \times 10^{15}$ (/cm$^2$), and that a diffusion depth is set at about 1 to 3 (μm), for example. The P type diffusion layer 9 is formed under diffusion conditions, that an impurity concentration in its surface is set at about $1.0 \times 10^{15}$ to $1.0 \times 10^{16}$ (/cm$^2$), and that a diffusion depth is set at about 0.5 to 1.5 (μm), for example. In addition, the P type diffusion layers 6 to 9 are used as the back gate region.

The N type diffusion layers 10 and 11 are formed in the P type diffusion layer 7. The N type diffusion layers 10 and 11 are used as the source region. The N type diffusion layers 10 and 11 and the P type diffusion layer 9 are connected to a source electrode 23, and are set to have the same potential. Note that the N type diffusion layers 10 and 11 may be circularly formed around the P type diffusion layer 9.

The N type diffusion layers 12 and 13 are formed in the epitaxial layer 4. The N type diffusion layers 12 and 13 are used as the drain region. Note that, although not shown in FIG. 1, the N type diffusion layers 12 and 13 are circularly formed so as to surround the P type diffusion layer 6.

The gate electrodes 14 and 15 are formed on a gate oxide film 16. The gate electrodes 14 and 15 are formed of, for example, a polysilicon film, a tungsten silicide film and the like, so as to have a desired thickness. Moreover, the P type diffusion layers 6 and 7 positioned below the gate electrodes 14 and 15 are used as a channel region. Note that the gate electrodes 14 and 15 may be circularly formed.

P type diffusion layers 17 and 18 are formed in the epitaxial layer 4. The P type diffusion layers 17 and 18 are circularly formed around the P type diffusion layer 6. Moreover, the P type diffusion layers 17 and 18 are formed as floating diffusion layers. The P type diffusion layers 17 and 18 are set in a state where a fixed potential is applied thereto by being capacitively coupled to a wiring layer (not shown) formed on an insulating layer 19. Thereby, breakdown voltage characteristics of the N-channel MOS transistor 1 are improved.

The insulating layer 19 is formed on the epitaxial layer 4. The insulating layer 19 is formed of a BPSG (Boron Phospho Silicate Glass) film, a SOG (Spin On Glass) film or the like. By use of a heretofore known photolithography technique, contact holes 20 and 21 are formed in the insulating layer 19 by dry etching using, for example, CHF$_3$ or CF$_4$ gas. Note that, although not shown in FIG. 1, the contact hole 21 may be circularly formed on the N type diffusion layer 13 or may be individually formed.

In the contact holes 20 and 21, aluminum alloy films 22 made of, for example, an Al—Si film, an Al—Si—Cu film, an Al—Cu film or the like are selectively formed. Thereby, the source electrode 23 and a drain electrode 24 are formed. Note that, although no wiring layer for the gate electrodes 14 and 15 is shown in the cross-section shown in FIG. 1, the electrodes are connected to the wiring layer in other regions. Moreover, the drain electrode 24 may be circularly formed on the N type diffusion layer 13 or may be individually formed.

Next, the NPN transistor 2 mainly includes the P type single crystal silicon substrate 3, the N type epitaxial layer 4, an N type buried diffusion layer 25 used as a collector region, N type diffusion layers 26 to 30 used as the collector region, P type diffusion layers 31 to 34 used as a base region, and an N type diffusion layer 35 used as an emitter region.

The N type epitaxial layer 4 is formed on the P type single crystal silicon substrate 3. Note that the substrate 3 and the epitaxial layer 4 in this embodiment correspond to a "semiconductor layer" of the present invention. Although the case where one epitaxial layer 4 is formed on the substrate 3 is described in this embodiment, the present invention is not limited to this case. For example, as the "semiconductor layer" of the embodiment of the present invention, only the substrate may be used or a plurality of epitaxial layers may be stacked on the substrate. Moreover, the substrate may be an N type single crystal silicon substrate or a compound semiconductor substrate.

The N type buried diffusion layer 25 is formed so as to extend in both the substrate 3 and the epitaxial layer 4. The N type buried diffusion layer 25 is used as the collector region.

The N type diffusion layer 26 is formed in the epitaxial layer 4, and is used as the collector region.

The N type diffusion layers 27 to 30 are formed in the N type diffusion layer 26. The N type diffusion layers 27 and 29 are formed so as to have a double diffusion structure. Meanwhile, the N type diffusion layers 28 and 30 are formed so as to have a double diffusion structure. The N type diffusion layers 27 to 30 are used as the collector region. Moreover, the N type diffusion layers 27 and 29 and the N type diffusion layers 28 and 30 are formed respectively on both sides of the P type diffusion layer 31 in a way that the N type diffusion layers 27 and 29 and the N type diffusion layers 28 and 30 sandwich the P type diffusion layer 31 therebetween.

The P type diffusion layers 31 and 32 are formed in the N type diffusion layer 26. The P type diffusion layer 31 is formed under diffusion conditions that, for example, an impurity concentration in its surface is set at about $1.0 \times 10^{13}$ to $1.0 \times 10^{14}$ (/cm$^2$) and a diffusion depth is set at about 2 to 4 (μm). The P type diffusion layer 32 is formed under diffusion conditions that, for example, an impurity concentration in its surface is set at about $1.0 \times 10^{14}$ to $1.0 \times 10^{15}$ (/cm$^2$) and a diffusion depth is set at about 1 to 3 (μm). Moreover, the P type diffusion layers 31 and 32 are formed to have a double diffusion structure and used as the base region.

The P type diffusion layers 33 and 34 are formed in a region where the P type diffusion layers 31 and 32 overlap each other. The P type diffusion layers 33 and 34 are used as a base lead-out region. Moreover, the P type diffusion layers 33 and 34 are formed on both sides of the N type diffusion layer 35 so as to sandwich the N type diffusion layer 35 therebetween.

The N type diffusion layer 35 is formed in the region where the P type diffusion layers 31 and 32 overlap each other. The N type diffusion layer 35 is used as the emitter region.

The insulating layer 19 is formed on the epitaxial layer 4. By use of the heretofore known photolithography technique, contact holes 36 to 40 are formed in the insulating layer 19 by dry etching using, for example, CHF$_3$ or CF$_4$ gas. Note that the contact holes 36 and 40 may be circularly formed or may be individually formed. Moreover, the contact holes 37 and 39 may be circularly formed or may be individually formed.

In the contact holes 36 to 40, aluminum alloy films, for example, Al—Si films are selectively formed. Accordingly, collector electrodes 41 and 42, an emitter electrode 43 and base electrodes 44 and 45 are formed respectively in the contact holes.

FIG. 2 shows a relationship between a cutoff frequency (fT) and a collector current (Ic) according to structures of the base region and the collector region in the NPN transistor 2.

In the structure indicated by the solid line, the N type diffusion layer 26 is not formed and any one of the N type diffusion layers 27 and 29 and the N type diffusion layers 28 and 30 are formed in the drain region. Meanwhile, in the base region, any one of the P type diffusion layers 33 and 34 is formed as the base lead-out region for the P type diffusion layer 31. That is, in the above structure, the collector region is formed only on one side of the base region and the base lead-out region is formed only on one side of the emitter region.

In the structure indicated by the dotted line, the N type diffusion layer 26 is not formed and the N type diffusion layers 27 to 30 are formed in the drain region. Meanwhile, in the base region, both of the P type diffusion layers 33 and 34 as the base lead-out regions are formed for the P type diffusion layer 31. That is, in the above structure, the collector regions are formed on both sides of the base region and the base lead-out regions are formed on both sides of the emitter region. In this structure, a distance between the base and the collector is shortened, and thereby a collector resistance value can be reduced. Furthermore, a distance between the emitter and the base is shortened, and thereby a base resistance value can be reduced.

In the structure indicated by the dashed line, the N type diffusion layer 26 is formed and the N type diffusion layers 27 to 30 are formed for the N type diffusion layer 26 in the drain region. Meanwhile, in the base region, both of the P type diffusion layers 33 and 34 as the base lead-out regions are formed for the P type diffusion layer 31. Specifically, in the above structure, the collector regions are formed on both sides of the base region and the base lead-out regions are formed on both sides of the emitter region in the formation region of the N type diffusion layer 26. In this structure, as described above, the collector resistance value and the base resistance value are reduced, and the collector resistance value can be further reduced by the N type diffusion layer 26.

In the structure indicated by the double dashed line, the N type diffusion layer 26 is formed and the N type diffusion layers 27 to 30 are formed for the N type diffusion layer 26 in the drain region. Meanwhile, in the base region, the P type diffusion layers 31 and 32 are formed so as to have a double diffusion structure and both of the P type diffusion layers 33 and 34 as the base lead-out regions are formed for the P type diffusion layers 31 and 32. That is, by forming the base region so as to have the double diffusion structure, an impurity concentration in the surface of the base region and in a region adjacent thereto is set high. Meanwhile, an impurity concentration of the base region positioned in a deep portion of the epitaxial layer 4 is set low. Moreover, as described above, in the above structure, the collector regions are formed on both sides of the base region and the base lead-out regions are formed on both sides of the emitter region in the formation region of the N type diffusion layer 26. In this structure, both of the collector resistance value and the base resistance value are reduced, and the collector resistance value can be further reduced by the N type diffusion layer 26. Moreover, the base resistance value is further reduced by the P type diffusion layer 32.

As shown in FIG. 2, in the structure indicated by the double dashed line, for example, the collector current (Ic) is about $1.0 \times 10^{15}$ (A) and the cutoff frequency (fT) is improved to about 1.8 times that of the structure indicated by the solid line. That is, by forming the base region so as to have the double diffusion structure or by forming the base region having the double diffusion structure in the N type diffusion layer 26 as the collector region, high frequency characteristics of the NPN transistor 2 can be improved.

FIG. 3 shows a relationship between a current amplification factor (hfe) and a collector current (Ic) according to the structures of the base region and the collector region in the NPN transistor 2.

In the structure indicated by the solid line, as in the description of the structure indicated by the solid line in FIG. 2, the N type diffusion layer 26 as the collector region is not formed, the collector region is formed only on one side of the base region and the base lead-out region is formed only on one side of the emitter region.

In the structure indicated by the dotted line, as in the description of the structure indicated by the dotted line in FIG. 2, the N type diffusion layer 26 as the collector region is not formed, the collector regions are formed on both sides of the base region and the base lead-out regions are formed on both sides of the emitter region.

In the structure indicated by the triple dashed line, the N type diffusion layer 26 is not formed and any one of the N type diffusion layers 27 and 29 and the N type diffusion layers 28 and 30 are formed in the drain region. Meanwhile, in the base region, both of the P type diffusion layers 33 and 34 are formed as the base lead-out regions for the P type diffusion layer 31. That is, in the above structure, the collector region is formed only on one side of the base region and the base lead-out regions are formed on both sides of the emitter region. In this structure, a distance between the emitter and the base is shortened, and thereby a base resistance value can be reduced.

In the structure indicated by the dashed line, as in the description of the structure indicated by the dashed line in FIG. 2, by forming the base region so as to have the double diffusion structure, an impurity concentration in the surface of the base region and in a region adjacent thereto is set high. Meanwhile, an impurity concentration of the base region positioned in a deep portion of the epitaxial layer 4 is set low. Moreover, in the above structure, the collector regions are formed on both sides of the base region and the base lead-out regions are formed on both sides of the emitter region in the formation region of the N type diffusion layer 26.

As shown in FIG. 3, in the structure indicated by the triple dashed line, for example, the collector current (Ic) is about $1.0 \times 10^{14}$ (A) and the current amplification factor (hfe) is improved by about 15 compared with the structure indicated by the solid line. Furthermore, in the structure indicated by the dashed line, for example, the collector current (Ic) is about $1.0 \times 10^{-6}$ (A) and the current amplification factor (hfe) is improved by about 15 compared with the structure indicated by the triple dashed line.

Moreover, comparing the structure indicated by the dotted line with the structure indicated by the triple dashed line, the current amplification factor (hfe) takes an approximately constant value within a range where the collector current (Ic) is constant. For this reason, by forming the structure in which the base lead-out regions are formed on both sides of the emitter region, the current amplification factor (hfe) can be improved.

FIG. 4 shows a relationship between a collector-emitter current (Ice) and a collector-emitter voltage (Vce) according to the structure of the collector region in the NPN transistor 2.

In the structure indicated by the solid line, as in the description of the structure indicated by the solid line in FIG. 2, the N type diffusion layer 26 as the collector region is not formed, the collector region is formed only on one side of the base region and the base lead-out region is formed only on one side of the emitter region.

In the structure indicated by the dashed line, as in the description of the structure indicated by the dashed line in FIG. 2, the collector regions are formed on both sides of the base region and the base lead-out regions are formed on both sides of the emitter region in the formation region of the N type diffusion layer 26.

As shown in FIG. 4, in the structure indicated by the dashed line, the collector resistance is reduced and the collector-emitter current (Ice) is slightly increased by forming the N type diffusion layer 26, compared with the structure indicated by the solid line. However, even in the structure having the N type diffusion layer 26 formed therein, deterioration of a collector-emitter breakdown voltage characteristics (Vceo) can be prevented.

As described above, in this embodiment, the base region has the double diffusion structure including the P type diffusion layers 31 and 32. Moreover, the P type diffusion layer 32 is formed so as to set a high impurity concentration in the surface of the P type diffusion layer 31 and in the region adjacent thereto. This structure reduces the base resistance value and enables improvement in the high frequency characteristics of the NPN transistor 2 and in the current amplification factor (hfe) thereof. Meanwhile, by setting the P type diffusion layer 31 diffused to the deep portion of the epitaxial layer 4 to have a low impurity concentration, deterioration of breakdown voltage characteristics (Vceo) of the NPN transistor 2 is prevented.

Moreover, in the collector region, the N type diffusion layer 26 is formed across the formation region of the NPN transistor 2. This structure reduces the collector resistance value, and enables improvement in the high frequency characteristics of the NPN transistor 2 and in the current amplification factor (hfe) thereof. Meanwhile, as shown in FIG. 4, deterioration of the breakdown voltage characteristics (Vceo) of the NPN transistor 2 is prevented.

Note that, although the description was given of the case where the base region is formed so as to have the double diffusion structure in this embodiment, the embodiment of the present invention is not limited to this case. For example, in the case where the base region is formed by forming three or more of P type diffusion layers so as to overlap one another, the embodiment of the present invention may be applied to the structure in which the impurity concentration in the surface of the base region and in the region adjacent thereto is set high and the impurity concentration in the deep portion of the epitaxial layer is set low. This structure can also improve the characteristics of the NPN transistor described above.

Moreover, although the description was given of the case where the N type diffusion layers as the drain region are formed on both sides of the P type diffusion layer as the base region, the embodiment of the present invention is not limited to this case. For example, the embodiment of the present invention may be applied to a case where the N type diffusion layer as the drain region is circularly formed around the P type diffusion layer as the base region. Moreover, the embodiment of the present invention may be applied to a case where a plurality of N type diffusion layers as the drain region are formed around the P type diffusion layer as the base region. This structure can further reduce the collector resistance value and improve the characteristics of the NPN transistor described above.

Moreover, although the description was given of the case where the P type diffusion layers as the base lead-out regions are formed on both sides of the N type diffusion layer as the emitter region, the embodiment of the present invention is not limited to this case. For example, the embodiment of the present invention may be applied to a case where the P type diffusion layer as the base lead-out region is circularly formed around the N type diffusion layer as the emitter region. Moreover, the embodiment of the present invention may be applied to a case where a plurality of P type diffusion layers as base lead-out regions are formed around the N type diffusion layer as the emitter region. This structure can further reduce the base resistance value and improve the characteristics of the NPN transistor described above. Besides the above, various changes can be made without departing from the scope of the embodiment of the present invention.

Next, with reference to FIGS. 5 to 14, detailed description will be given of a method of manufacturing a semiconductor device according to an embodiment of the present invention. FIGS. 5 to 14 are cross-sectional views showing the method of manufacturing a semiconductor device according to this embodiment.

Figure 5:
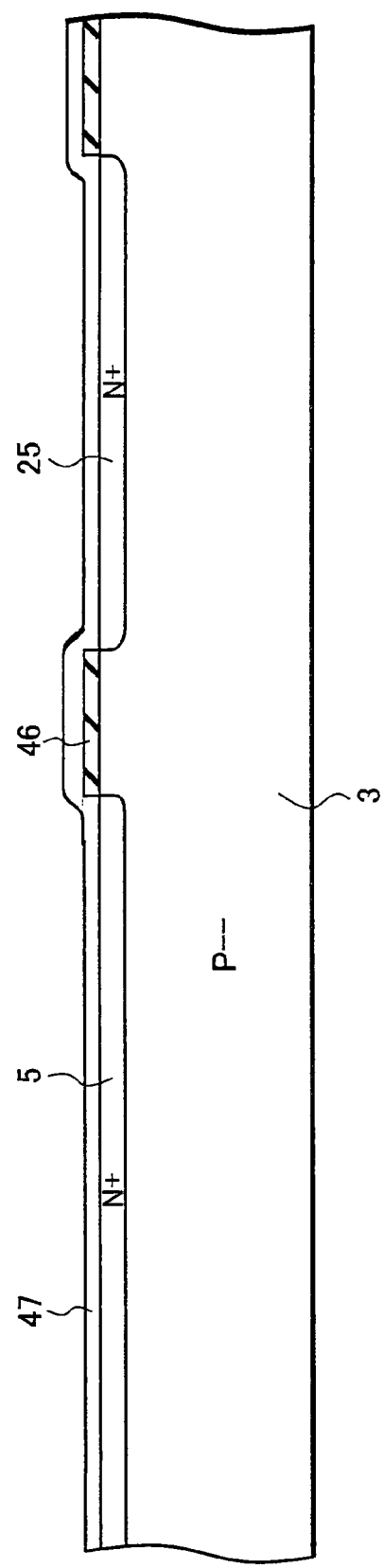
FIG. 5 is a cross-sectional view showing a method of manufacturing a semiconductor device according to an embodiment of the present invention.

First, as shown in FIG. 5, a P type single crystal silicon substrate 3 is prepared. A silicon oxide film 46 is formed on the substrate 3, and the silicon oxide film 46 is selectively removed so as to form openings on formation regions of N type buried diffusion layers 5 and 25. Thereafter, by using the silicon oxide film 46 as a mask, a liquid source 47 containing an N type impurity, for example, antimony (Sb) is applied onto a surface of the substrate 3 by use of a spin-coating method. Subsequently, after antimony (Sb) is thermally diffused to form the N type buried diffusion layers 5 and 25, the silicon oxide film 46 and the liquid source 47 are removed.

Figure 6:
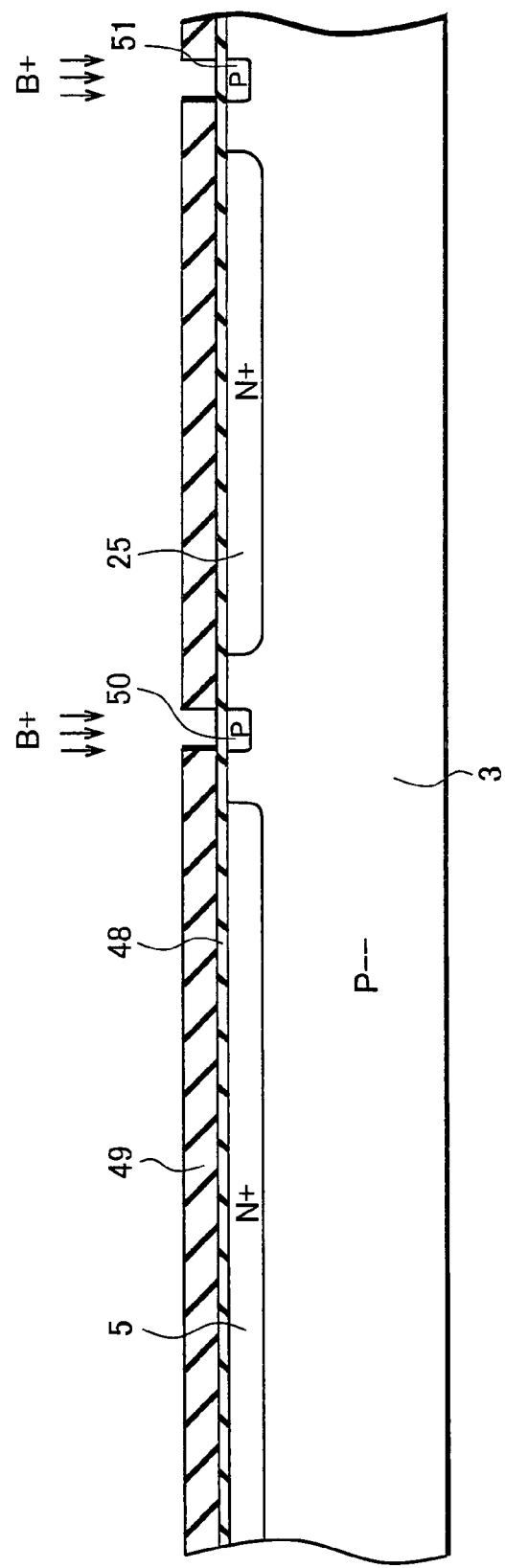
FIG. 6 is a cross-sectional view showing the method of manufacturing a semiconductor device according to the embodiment of the present invention.

Next, as shown in FIG. 6, a silicon oxide film 48 is formed on the substrate 3, and a photoresist 49 is formed on the silicon oxide film 48. Thereafter, by use of a heretofore known photolithography technique, openings are formed in the photoresist 49 on regions where P type buried diffusion layers 50 and 51 are to be formed. Subsequently, ions of a P type impurity, for example, boron (B) are implanted from the surface of the substrate 3 at an accelerating voltage of 70 to 90 (keV) and a dose of $1.0\times10^{14}$ to $1.0\times10^{15}$ (/cm$^2$). After the photoresist 49 is removed and the P type buried diffusion layers 50 and 51 are formed by thermal diffusion, the silicon oxide film 48 is removed.

Figure 7:
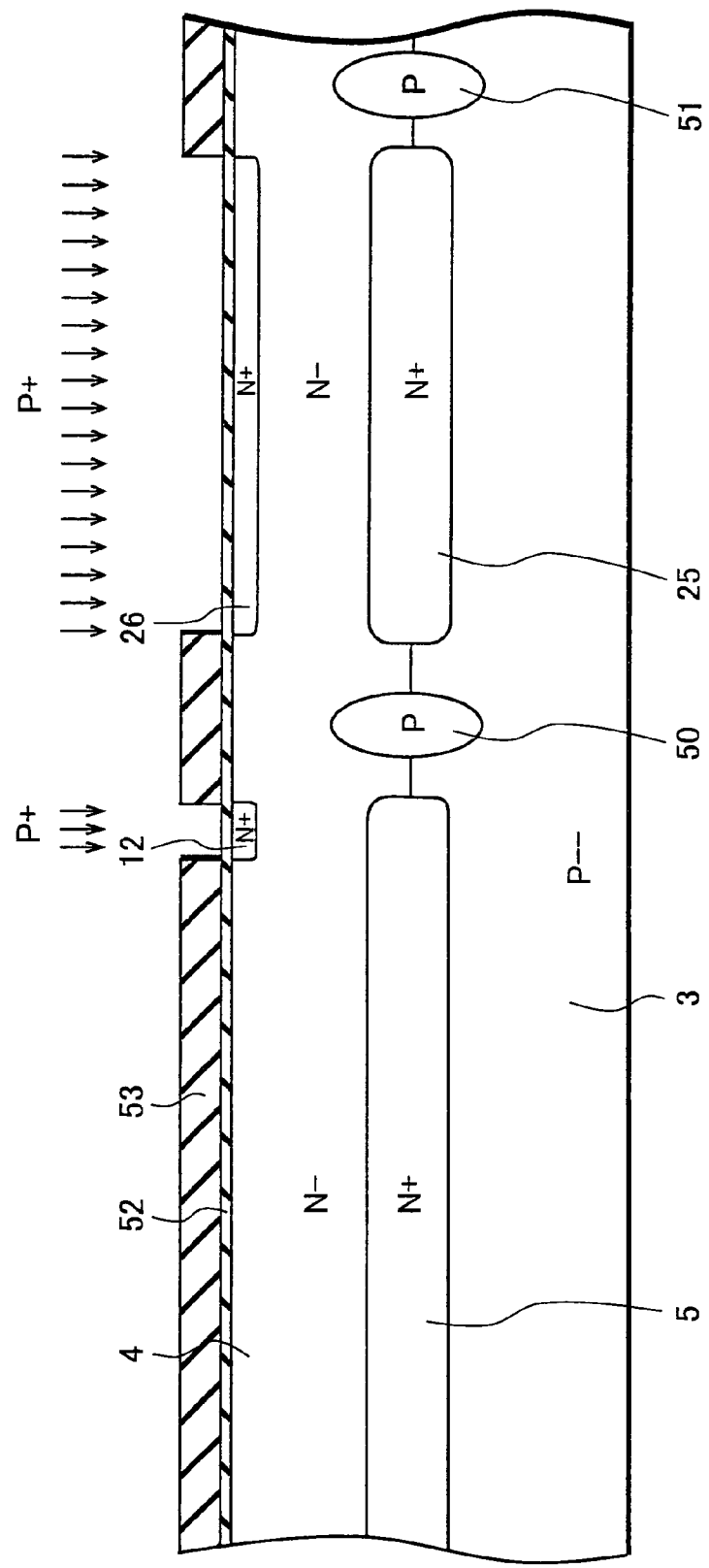
FIG. 7 is a cross-sectional view showing the method of manufacturing a semiconductor device according to the embodiment of the present invention.

Next, as shown in FIG. 7, the substrate 3 is placed on a susceptor of a vapor phase epitaxial growth apparatus, and an N type epitaxial layer 4 is formed on the substrate 3. The vapor phase epitaxial growth apparatus mainly includes a gas supply system, a reactor, an exhaust system and a control system. In this embodiment, by use of a vertical reactor, thickness uniformity of the epitaxial layer can be improved. The N type buried diffusion layers 5 and 25 and the P type buried diffusion layers 50 and 51 are thermally diffused by heat treatment in the step of forming the epitaxial layer 4.

Next, a silicon oxide film 52 is formed on the epitaxial layer 4, and a photoresist 53 is formed on the silicon oxide film 52. Thereafter, by use of the heretofore known photolithography technique, openings are formed in the photoresist 53 on regions where N type diffusion layers 12 and 26 are to be formed. Subsequently, ions of an N type impurity, for example, phosphorus (P) are implanted from the surface of the epitaxial layer 4 at an accelerating voltage of 70 to 90 (keV) and a dose of $1.0\times10^{12}$ to $1.0\times10^{13}$ (/cm$^2$). After phosphorus (P) is thermally diffused to form the N type diffusion layers 12 and 26, the silicon oxide film 52 is removed.

Figure 8:
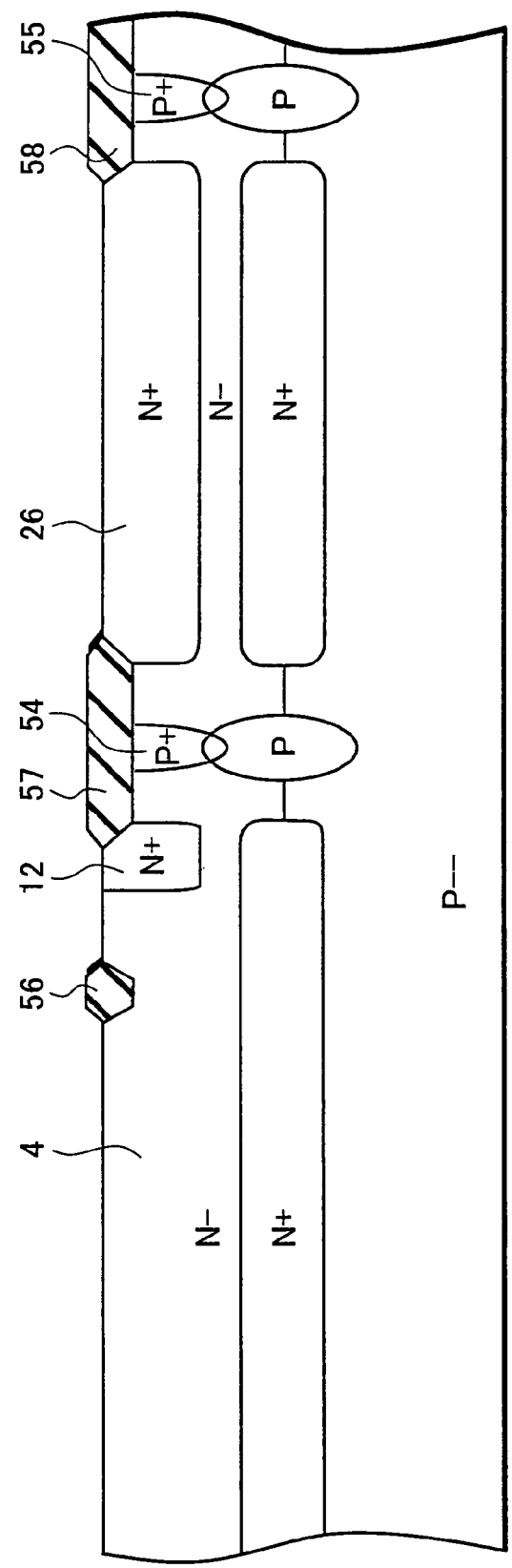
FIG. 8 is a cross-sectional view showing the method of manufacturing a semiconductor device according to the embodiment of the present invention.

Next, as shown in FIG. 8, by use of the heretofore known photolithography technique, P type diffusion layers 54 and 55 are formed in the epitaxial layer 4. Thereafter, LOCOS (Local Oxidation of Silicon) oxide films 56 to 58 are formed in desired regions of the epitaxial layer 4. In this event, each of the LOCOS oxide films 56 to 58 has a thickness of, for example, about 3000 to 10000 Å in its flat portion.

Figure 9:
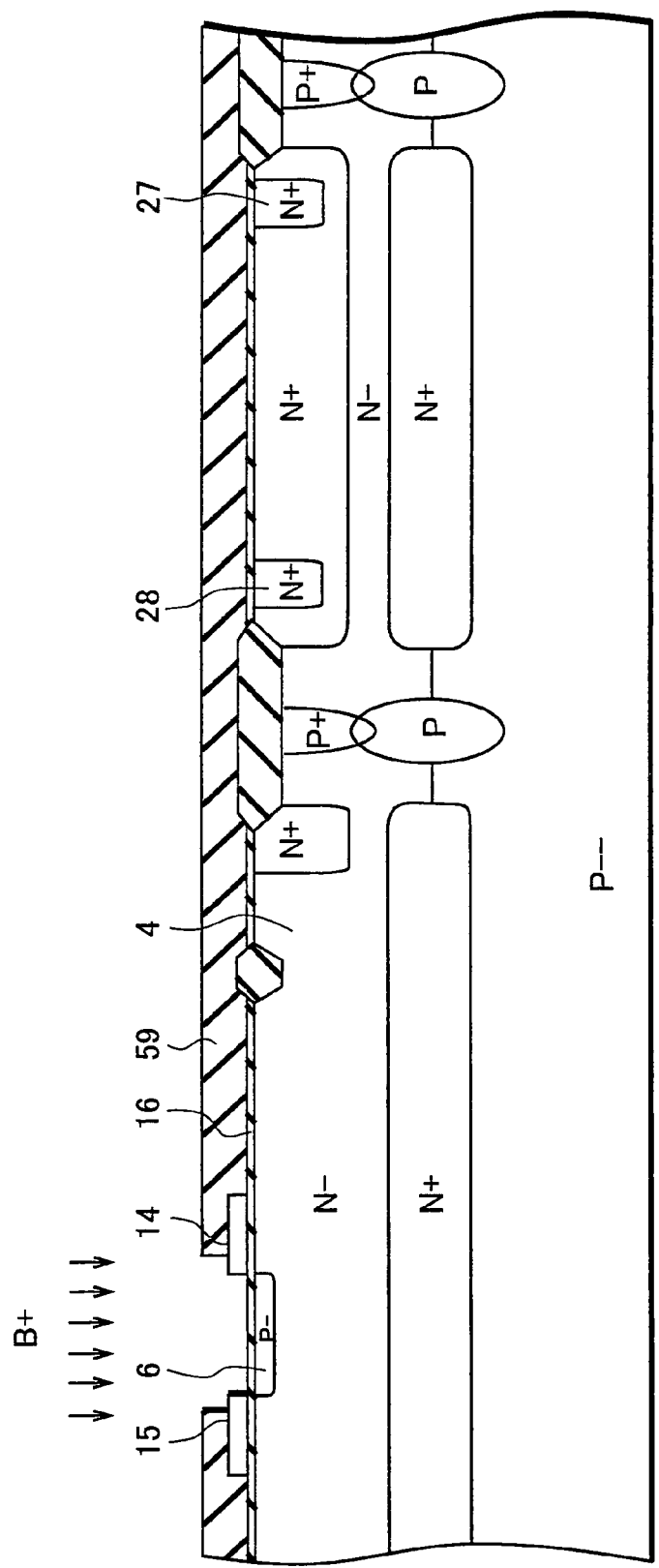
FIG. 9 is a cross-sectional view showing the method of manufacturing a semiconductor device according to the embodiment of the present invention.

Next, as shown in FIG. 9, by use of the heretofore known photolithography technique, N type diffusion layers 27 and 28 are formed in the epitaxial layer 4. Thereafter, a silicon oxide film to be used as a gate oxide film 16 is formed on the epitaxial layer 4. Subsequently, a polysilicon film and a tungsten silicide film, for example, are sequentially formed on the silicon oxide film to form gate electrodes 14 and 15 by use of the heretofore known photolithography technique. Thereafter, a photoresist 59 is formed on the silicon oxide film to be used as the gate oxide film 16. By use of the heretofore known photolithography technique, an opening is formed in the photoresist 59 on a region where a P type diffusion layer 6 is to be formed. Subsequently, ions of a P type impurity, for example, boron (B) are implanted from the surface of the epitaxial layer 4 at an accelerating voltage of 40 to 60 (keV) and a dose of $1.0\times10^{13}$ to $1.0\times10^{14}$ (/cm$^2$). Thereafter, the photoresist 59 is removed, and the P type diffusion layer 6 is formed by thermal diffusion.

Figure 10:
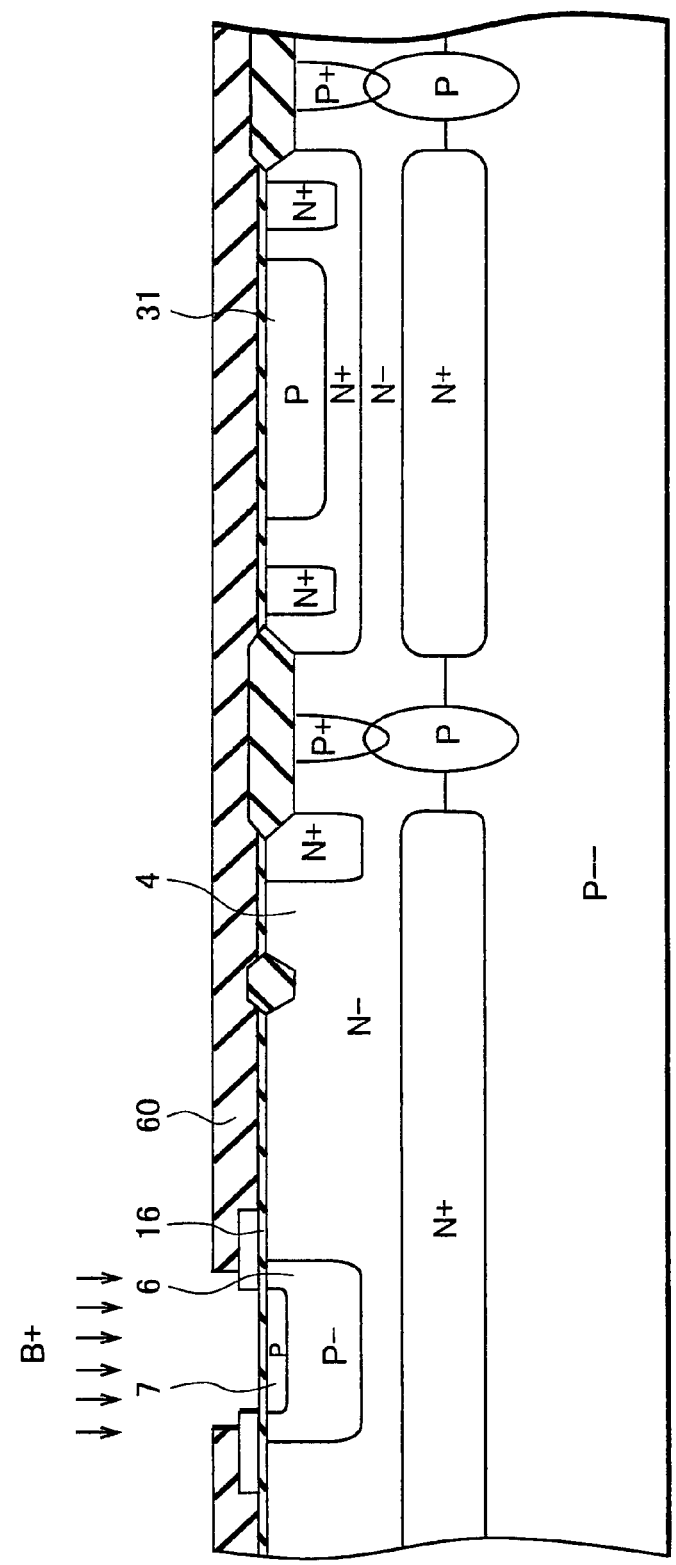
FIG. 10 is a cross-sectional view showing the method of manufacturing a semiconductor device according to the embodiment of the present invention.

Next, as shown in FIG. 10, by use of the heretofore known photolithography technique, a P type diffusion layer 31 is formed in the epitaxial layer 4. Thereafter, a photoresist 60 is formed on the silicon oxide film to be used as the gate oxide film 16. By use of the heretofore known photolithography technique, an opening is formed in the photoresist 60 on a region where a P type diffusion layer 7 is to be formed. Subsequently, ions of a P type impurity, for example, boron (B) are implanted from the surface of the epitaxial layer 4 at an accelerating voltage of 40 to 60 (keV) and a dose of $1.0\times10^{14}$ to $1.0\times10^{15}$ (/cm$^2$). Thereafter, the photoresist 60 is removed, and the P type diffusion layer 7 is formed by thermal diffusion.

Figure 11:
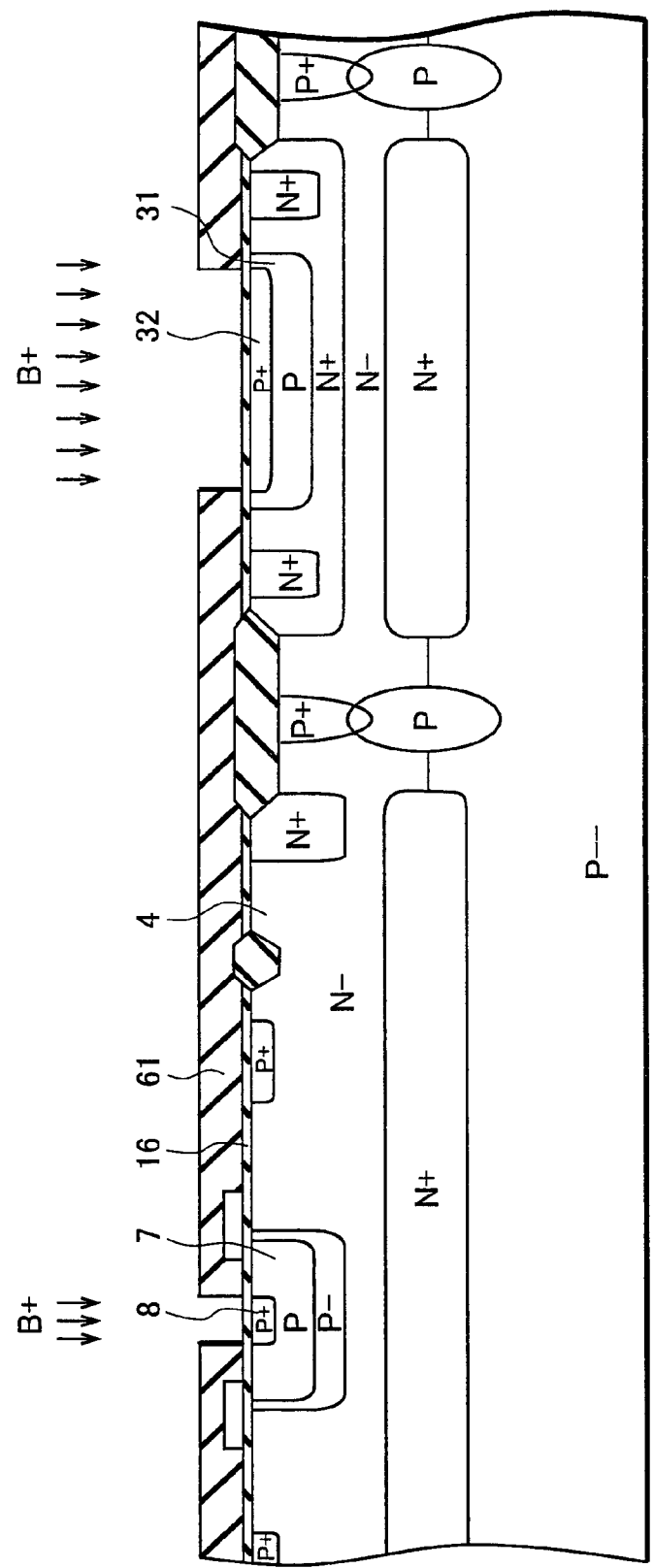
FIG. 11 is a cross-sectional view showing the method of manufacturing a semiconductor device according to the embodiment of the present invention.

Next, as shown in FIG. 11, a photoresist 61 is formed on the silicon oxide film to be used as the gate oxide film 16. By use of the heretofore known photolithography technique, openings are formed in the photoresist 61 on regions where P type diffusion layers 8 and 32 are to be formed. Subsequently, ions of a P type impurity, for example, boron (B) are implanted from the surface of the epitaxial layer 4 at an accelerating voltage of 40 to 60 (keV) and a dose of $1.0'10^{14}$ to $1.0\times10^{15}$ (/cm$^2$). Thereafter, the photoresist 61 is removed, and the P type diffusion layers 8 and 32 are formed by thermal diffusion.

Note that the P type diffusion layer 8 for a back gate region of an N-channel MOS transistor 1 and the P type diffusion layer 32 for a base region of an NPN transistor 2 are formed in the same step. Accordingly, the number of masks can be reduced, and thereby manufacturing costs can be reduced.

Figure 12:
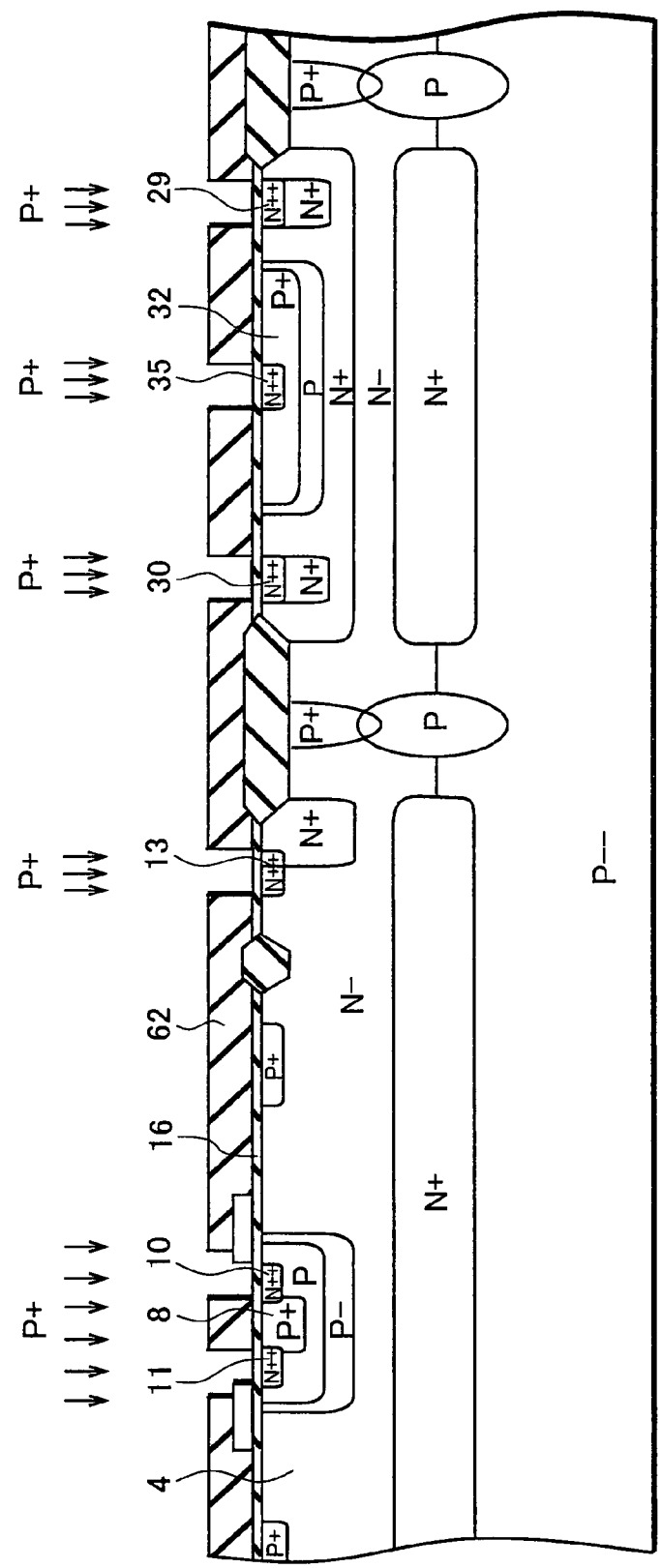
FIG. 12 is a cross-sectional view showing the method of manufacturing a semiconductor device according to the embodiment of the present invention.

Next, as shown in FIG. 12, a photoresist 62 is formed on the silicon oxide film to be used as the gate oxide film 16. By use of the heretofore known photolithography technique, openings are formed in the photoresist 62 on regions where N type diffusion layers 10, 11, 13, 29, 30 and 35 are to be formed. Subsequently, ions of an N type impurity, for example, phosphorus (P) are implanted from the surface of the epitaxial layer 4 at an accelerating voltage of 90 to 110 (keV) and a dose of $1.0\times10^{15}$ to $1.0\times10^{16}$ (/cm$^2$). Thereafter, the photoresist 62 is removed, and the N type diffusion layers 10, 11, 13, 29, 30 and 35 are formed by thermal diffusion.

Figure 13:
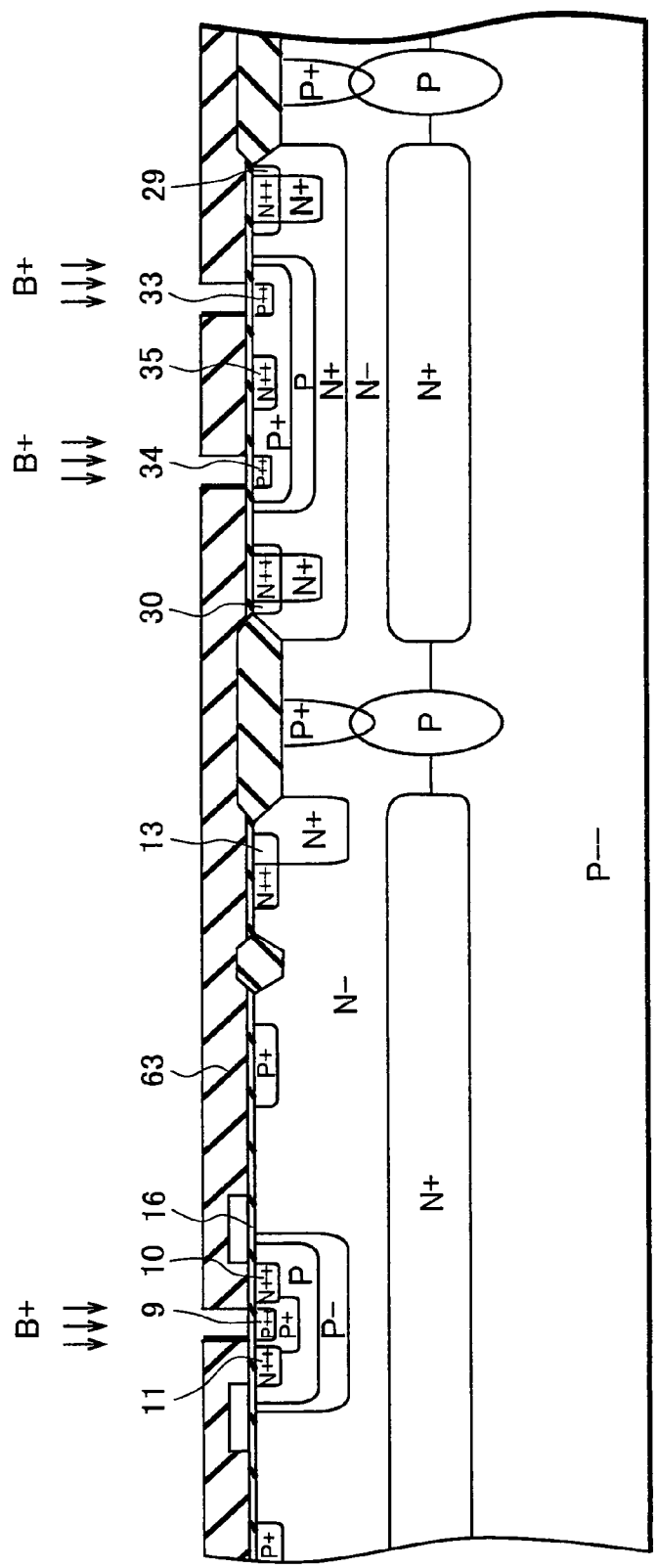
FIG. 13 is a cross-sectional view showing the method of manufacturing a semiconductor device according to the embodiment of the present invention.

Next, as shown in FIG. 13, a photoresist 63 is formed on the silicon oxide film to be used as the gate oxide film 16. By use of the heretofore known photolithography technique, openings are formed in the photoresist 63 on regions where P type diffusion layers 9, 33 and 34 are to be formed. Subsequently, ions of a P type impurity, for example, boron (B) are implanted from the surface of the epitaxial layer 4 at an accelerating voltage of 40 to 60 (keV) and a dose of $1.0\times10^{15}$ to $1.0\times10^{16}$ (/cm$^2$). Thereafter, the photoresist 63 is removed, and the P type diffusion layers 9, 33 and 34 are formed by thermal diffusion.

Figure 14:
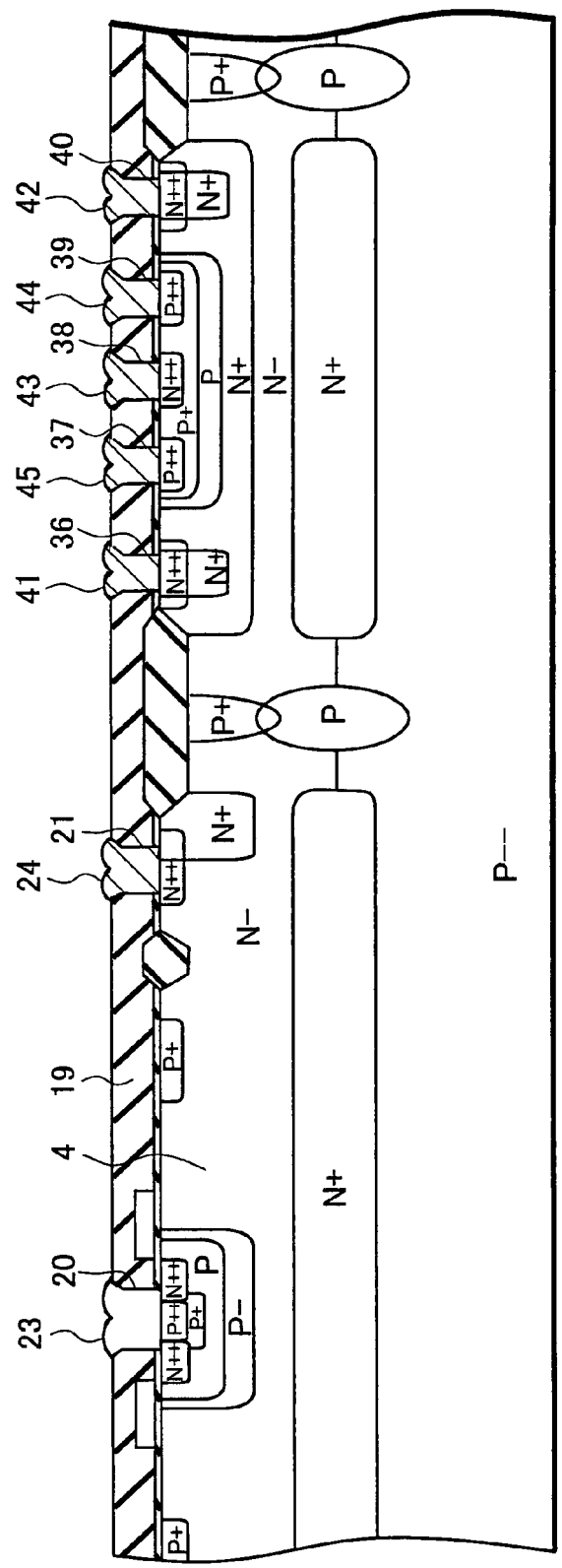
FIG. 14 is a cross-sectional view showing the method of manufacturing a semiconductor device according to the embodiment of the present invention.

Next, as shown in FIG. 14, on the epitaxial layer 4, a BPSG film, a SOG film and the like, for example, are deposited as an insulating layer 19. Subsequently, by use of the heretofore known photolithography technique, contact holes 20, 21 and 36 to 40 are formed in the insulating layer 19 by dry etching using, for example, CHF$_3$ or CF$_4$ gas. In the contact holes 20, 21 and 36 to 40, aluminum alloy films made of, for example, an Al—Si film, an Al—Si—Cu film, an Al—Cu film and the like are selectively formed. Thereby, a source electrode 23, a drain electrode 24, collector electrodes 41 and 42, an emitter electrode 43 and base electrodes 44 and 45 are formed.

Note that, in this embodiment, the description was given of the case where the P type diffusion layer 8 as the back gate region of the N-channel MOS transistor 1 and the P type diffusion layer 32 as the base region of the NPN transistor 2 are formed in the same step. However, the embodiment of the present invention is not limited to the above case. For example, the embodiment of the present invention may be applied to a case where the step of forming the P type diffusion layer 8 and the step of forming the P type diffusion layer 32 are set to be dedicated steps, respectively. Besides the above, various changes can be made without departing from the scope of the embodiment of the present invention.

What is claimed is:

1. A semiconductor device comprising:
   a semiconductor layer;
   a diffusion layer of one conductivity type, which is formed in the semiconductor layer, and which serves as a base region, wherein the diffusion layer of the one conductivity type comprises first and second diffusion layers of the one conductivity type, wherein the entirety of the second diffusion layer of the one conductivity type overlaps a formation region of the first diffusion layer of the one conductivity type;
   a first diffusion layer of opposite conductivity type, which is formed in the diffusion layer of the one conductivity type, and which serves as an emitter region;
   a second diffusion layer of the opposite conductivity type, which is formed in the semiconductor layer, and which serves as a collector region;
   a third diffusion layer of the opposite conductivity type, which is formed in the semiconductor layer, and which serves as the collector region,
   wherein, in a formation region of the third diffusion layer of the opposite conductivity type, the second diffusion layer of the opposite conductivity type and the diffusion layer of the one conductivity type are formed.

2. The semiconductor device according to claim 1, wherein a third diffusion layer of the one conductivity type is formed in the second diffusion layer of the one conductivity type so as to sandwich the first diffusion layer of the opposite conductivity type.

3. The semiconductor device according to claim 1, wherein the second diffusion layer of the opposite conductivity type is formed so as to sandwich the first diffusion layer of the one conductivity type.

4. The semiconductor device according to claim 1, wherein, in the second diffusion layer of the one conductivity type, a plurality of third diffusion layers of the one conductivity type are formed around the first diffusion layer of the opposite conductivity type.

5. The semiconductor device according to claim 1, wherein a plurality of the second diffusion layers of the opposite conductivity type are formed around the first diffusion layer of the one conductivity type.

6. The semiconductor device according to claim 1 wherein the second diffusion layer of the one conductivity type has a higher concentration of dopants than the first diffusion layer of the one conductivity type.

* * * * *